US008471379B2

(12) United States Patent
Danno et al.

(10) Patent No.: US 8,471,379 B2
(45) Date of Patent: Jun. 25, 2013

(54) SEMICONDUCTOR DEVICE

(75) Inventors: Tadatoshi Danno, Takasaki (JP); Toru Nagamine, Takasaki (JP); Hiroshi Mori, Takasaki (JP); Tsukasa Ichinose, Takasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/362,076

(22) Filed: Jan. 31, 2012

(65) Prior Publication Data

US 2012/0126900 A1    May 24, 2012

Related U.S. Application Data

(63) Continuation of application No. 13/020,494, filed on Feb. 3, 2011, now Pat. No. 8,115,295, which is a continuation of application No. 12/559,941, filed on Sep. 15, 2009, now Pat. No. 7,982,301, which is a continuation of application No. 13/138,505, filed on May 27, 2005, now Pat. No. 7,608,922.

(30) Foreign Application Priority Data

May 31, 2004  (JP) ................................ 2004-161300

(51) Int. Cl.
*H01L 23/52* (2006.01)
*H01L 23/06* (2006.01)
(52) U.S. Cl.
USPC ............ 257/691; 257/684; 257/738; 257/780
(58) Field of Classification Search
USPC ................ 257/684, 690–692, 730, 737, 738, 257/780, 784, 786, E23.071, E23.153, E25.014
See application file for complete search history.

(56) References Cited

U.S. PATENT DOCUMENTS

| 4,725,878 | A  |   | 2/1988  | Miyauchi et al. |
|-----------|----|---|---------|-----------------|
| 5,321,299 | A  | * | 6/1994  | Ohkawa et al. ................ 257/528 |
| 6,384,701 | B1 |   | 5/2002  | Yamada et al.   |
| 6,479,845 | B2 | * | 11/2002 | Chen ............................ 257/211 |

(Continued)

FOREIGN PATENT DOCUMENTS

| JP | 61-234055 | 10/1986 |
|----|-----------|---------|
| JP | 11-312776 | 11/1999 |

(Continued)

OTHER PUBLICATIONS

Office Action in JP 2010-199745, dispatched Oct. 2, 2012, (in Japanese); [English language translation, 3 pgs.]

*Primary Examiner* — Hung Vu
(74) *Attorney, Agent, or Firm* — Antonelli, Terry, Stout & Kraus, LLP.

(57) ABSTRACT

A semiconductor device includes a semiconductor chip with first and second low noise amplifier for amplifying an inputted signal. The chip is mounted over a wiring substrate which includes first and second electrodes and first, second and third GND electrodes. The wiring substrate includes first and second conductor patterns, wherein the first conductor pattern electrically connects the first and second GND electrodes and surrounds the first and second electrodes in a plan view. The second conductor pattern electrically connects the first conductor pattern and the third GND electrode to each other and is arranged between the first and second electrodes in the plan view. The first conductor pattern extends toward an inside of the semiconductor chip from the first and second GND electrodes in the plan view.

15 Claims, 11 Drawing Sheets

U.S. PATENT DOCUMENTS

| | | |
|---|---|---|
| 6,483,175 B2 | 11/2002 | Yoshida |
| 6,580,163 B2 | 6/2003 | Poulin |
| 6,770,963 B1 | 8/2004 | Wu |
| 6,847,108 B2 | 1/2005 | Takikawa et al. |
| 6,937,458 B2 | 8/2005 | Seshan |
| 6,982,494 B2 | 1/2006 | Anzai |
| 7,020,444 B2 | 3/2006 | Shinbo et al. |
| 7,253,513 B2 * | 8/2007 | Miyazawa .................. 257/691 |
| 7,425,458 B2 | 9/2008 | Seshan |
| 7,425,756 B2 | 9/2008 | Danno et al. |
| 7,709,937 B2 | 5/2010 | Danno |
| 2005/0161798 A1 | 7/2005 | Ninomiya et al. |

FOREIGN PATENT DOCUMENTS

| | | |
|---|---|---|
| JP | 2001-230342 | 8/2001 |
| JP | 2004-079579 | 3/2004 |
| WO | WO 03/094232 | 11/2003 |
| WO | WO 2004/010497 | 1/2004 |

* cited by examiner

SEMICONDUCTOR DEVICE

CROSS-REFERENCE TO RELATED APPLICATION

This application is a continuation of U.S. patent application Ser. No. 13/020,494, filed Feb. 3, 2011 now U.S. Pat. No. 8,115,295, which, in turn, is a continuation of U.S. patent application Ser. No. 12/559,941, filed Sep. 15, 2009 (now U.S. Pat. No. 7,982,301), which, in turn, is a continuation of U.S. patent application Ser. No. 11/138,505, filed May 27, 2005 (now U.S. Pat. No. 7,608,922); and which application claims priority from Japanese patent application No. 2004-161300, filed on May 31, 2004, the content of which is hereby incorporated by reference into this application.

BACKGROUND OF THE INVENTION

The present invention relates in general to a semiconductor device; and, more particularly, it relates to a technology which is effective when applied to the miniaturization of a semiconductor device.

In a conventional integrated circuit package (semiconductor device), a filter device is coupled to at least one of a power supply line for supplying power to an integrated circuit that is packaged in the package and an earth line that provides for a reduction in electromagnetic interference caused by the integrated circuit. As an example, a plurality of filter capacitors are coupled between the power supply line and the earth line within or in the vicinity of a cavity in the package (see, e.g., Patent Document 1).

[Patent Document 1] Japanese Unexamined Patent Publication No. Hei 11(1999)-312776 (FIG. 2)

SUMMARY OF THE INVENTION

As an example of a semiconductor device in which a common lead is disposed for the purpose of taking measures against EMI or the like, there is a known structure in which ring-shaped common leads are disposed between a semiconductor chip and connection pads to serve as power supply lines and earth lines, such as the one shown in Patent Document 1 mentioned above. Typically, wire bonding is performed with respect to ring-shaped common leads serving as GNDs or power supply lines for the shared use thereof.

In a semiconductor device having such a structure, a common lead is shared by all of the GNDs and power supply lines so that the problem of noise resulting from the presence of a common impedance occurs.

When a ring-shaped common lead is provided, bumps which serve as external terminals cannot be provided on the bottom portion of the chip, so that the problem of the scaling up of the main body of the semiconductor device also occurs.

It is therefore an object of the present invention to provide a semiconductor device that can be miniaturized.

Another object of the present invention is to provide a semiconductor device having improved characteristics.

The above and other objects and novel features of the present invention will become more apparent from the description provided in the present specification and the accompanying drawings.

A brief description will be given in the form of an outline of representative aspects of the present invention as disclosed in the present application.

Specifically, one aspect of the present invention is exemplified by a semiconductor device comprising: a wiring substrate having a main surface and a back surface that is opposite to the main surface; a semiconductor chip that is mounted over the main surface of the wiring substrate, connected electrically to the wiring substrate, and which has a first circuit portion for amplifying an inputted signal and a second circuit portion for converting the frequency of a signal supplied from the first circuit portion; and a plurality of external terminals provided over the back surface of the wiring substrate, wherein a first common conductor portion which is connected electrically to the first circuit portion to supply a GND potential to the first circuit portion and a second common conductor portion which is connected electrically to the second circuit portion to supply the GND potential to the second circuit portion are provided over the wiring substrate, and the first and second common conductor portions are separated from each other.

Another aspect of the present invention is exemplified by a semiconductor device comprising: a wiring substrate having a main surface and a back surface that is opposite to the main surface; a semiconductor chip that is mounted over the main surface of the wiring substrate, connected electrically to the wiring substrate, and which has a first circuit portion for amplifying an inputted signal, a second circuit portion for converting the frequency of a signal supplied from the first circuit portion, and a third circuit portion for converting the frequency of the supplied signal; and a plurality of external terminals provided over the back surface of the wiring substrate, wherein a first common conductor portion which is connected electrically to the first circuit portion to supply a GND potential to the first circuit portion, a second common conductor portion which is connected electrically to the second circuit portion to supply the GND potential to the second circuit portion, and a third common conductor portion which is connected electrically to the third circuit portion to supply the GND potential to the third circuit portion are provided over the wiring substrate, and the first, second, and third common conductor portions are separated from each other.

Still another aspect of the present invention is exemplified by a semiconductor device comprising: a wiring substrate having a main surface and a back surface that is opposite to the main surface; a semiconductor chip that is mounted over the main surface of the wiring substrate, connected electrically to the wiring substrate, and which has a first circuit portion for amplifying an inputted signal and a plurality of other circuit portions that are separated from the first circuit portion; and a plurality of external terminals provided over the back surface of the wiring substrate, wherein a first common conductor portion which is connected electrically to the first circuit portion to supply a GND potential to the first circuit portion and other common conductor portions which are connected electrically to the plurality of other circuit portions to supply the GND potential to respective ones of the other circuit portions are provided in a separate relation over the wiring substrate, and the other common conductor portions are connected to a planar conductor portion that is provided over the main surface of the wiring substrate.

Yet another aspect of the present invention is exemplified by a semiconductor device comprising: a semiconductor chip having a first circuit portion and a second circuit portion; a wiring substrate having a first common conductor portion that is connected to a plurality of bonding electrodes over the substrate and a second common conductor portion that is connected to a plurality of other bonding electrodes over the substrate; and a plurality of external terminals provided over a back surface of the wiring substrate, wherein surface electrodes for GND for the first circuit portion of the semiconductor chip are connected to the first common conductor portion over the wiring substrate, surface electrodes for GND for the second circuit portion of the semiconductor chip are connected to the second common conductor portion over the wiring substrate, and the first and second common conductor portions are connected to external terminals over the back surface of the wiring substrate.

The following is a brief description of effects achievable by the representative aspects of the invention disclosed in the present application.

Since the first common conductor portion for supplying the GND potential to the first circuit portion in the chip and the second common conductor portion for supplying the GND potential to the second circuit portion in the chip are provided over the wiring substrate, and the first and second common conductor portions are separated from each other, it becomes possible to eliminate a common impedance, while allowing each of the circuit blocks to have a common GND to be used therein. Thus, the shared use of the GND makes it possible to achieve miniaturization of the semiconductor device. By further dividing the GND correspondingly relative to the individual circuit blocks, it becomes possible to reduce the common impedance and improve the characteristics of the semiconductor device.

DESCRIPTION OF THE PREFERRED EMBODIMENTS

Figure 1:
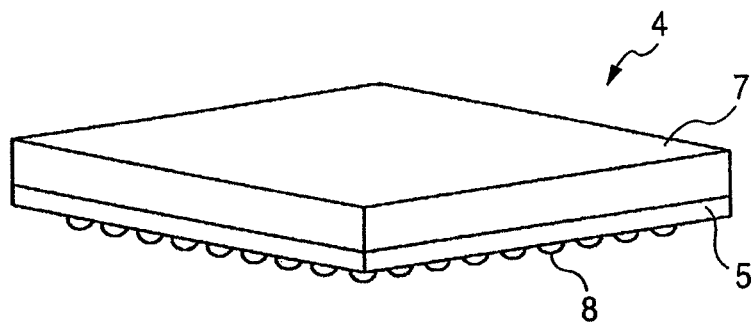
FIG. 1 is a perspective view showing an example of the structure of a semiconductor device according to a first embodiment of the present invention.

In the following description of the embodiments, a repeated description of the same or like parts will be omitted in principle unless particularly necessary.

In the following description, the subject matter of the present invention will be divided, if necessary for the sake of convenience, into a plurality of sections or embodiments. However, they are by no means irrelevant to each other, but are mutually related to each other, such that one of the sections or embodiments constitutes a variation, or a detailed or a complementary description, of some or all of the others.

If a number and the like of elements (including the number, numerical value, amount, and range thereof) is referred to in the following description of the embodiments, they are not limited to the specific number, unless particularly or explicitly indicated or unless they are obviously limited to specific numbers in principle. The number and the like of the elements may be less than or more than the specific number indicated.

Hereinbelow, the embodiments of the present invention will be described in detail with reference to the drawings. Throughout the drawings, parts having the same functions are designated by the same reference numerals, and a repeated description thereof will be omitted.

Embodiment 1

Figure 2:
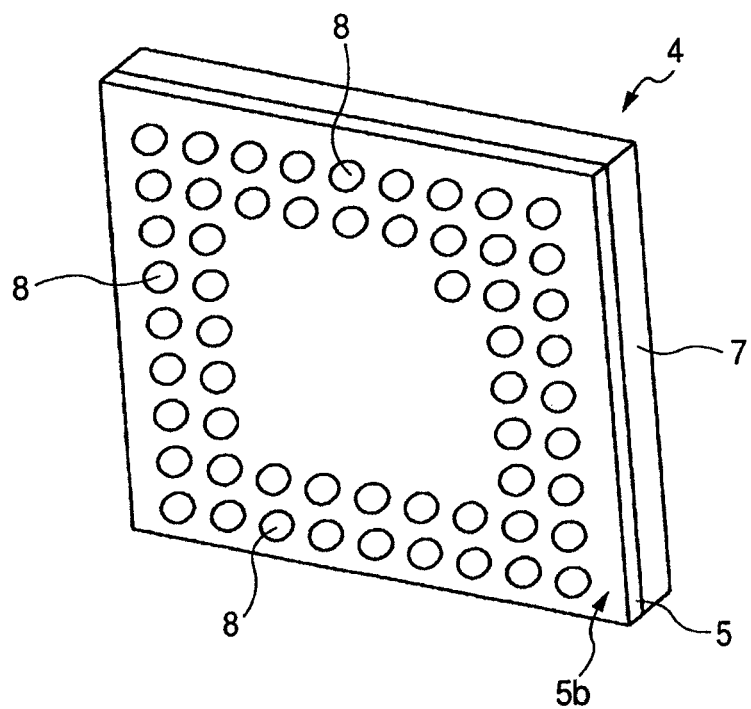
FIG. 2 is a perspective view showing an example of the arrangement of terminals on the back surface of the semiconductor device shown in FIG. 1.
Figure 3:
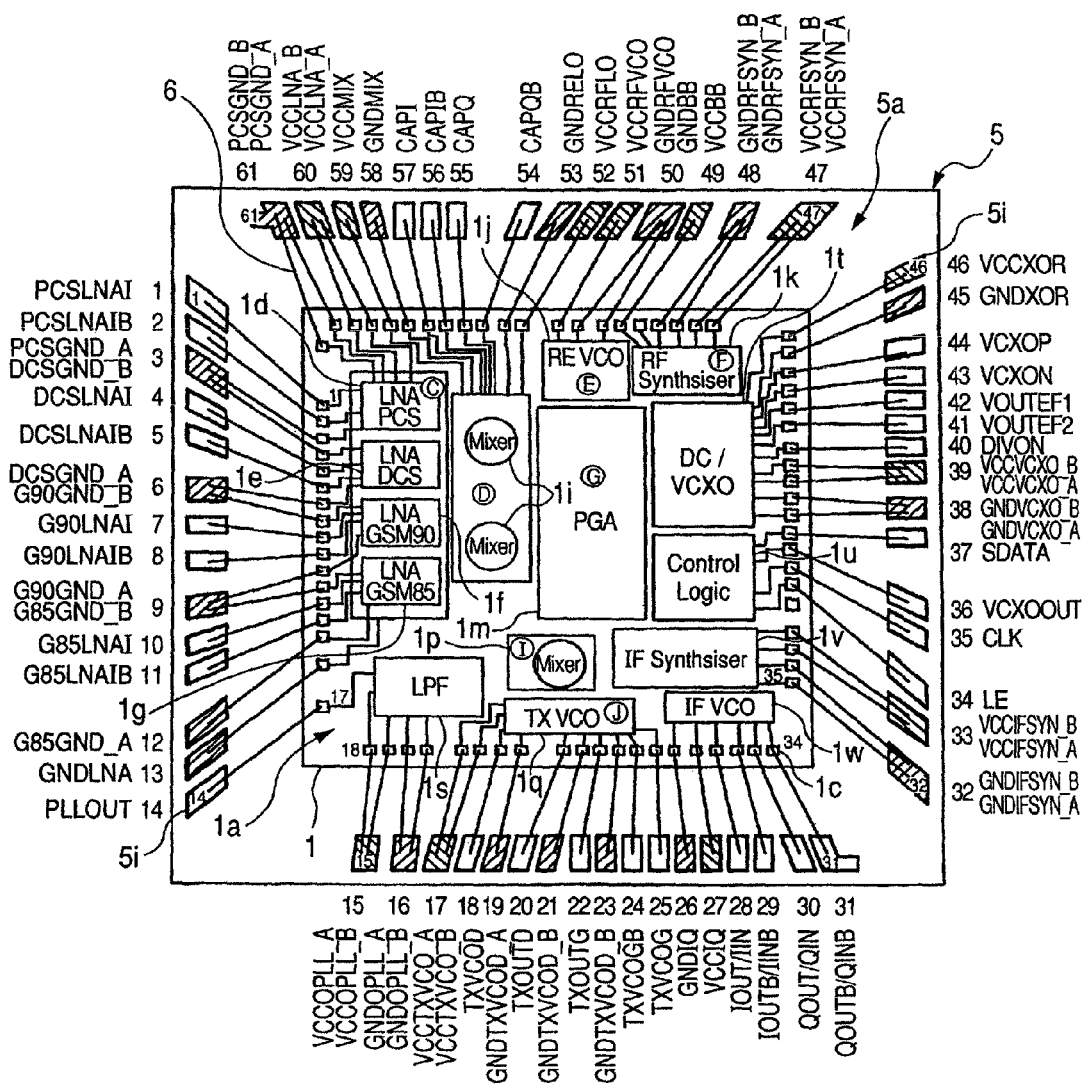
FIG. 3 is a plan view showing an example of the structure of circuit blocks in a semiconductor chip mounted on the semiconductor device shown in FIG. 1 and an example of the connecting condition thereof with bonding electrodes.
Figure 4:
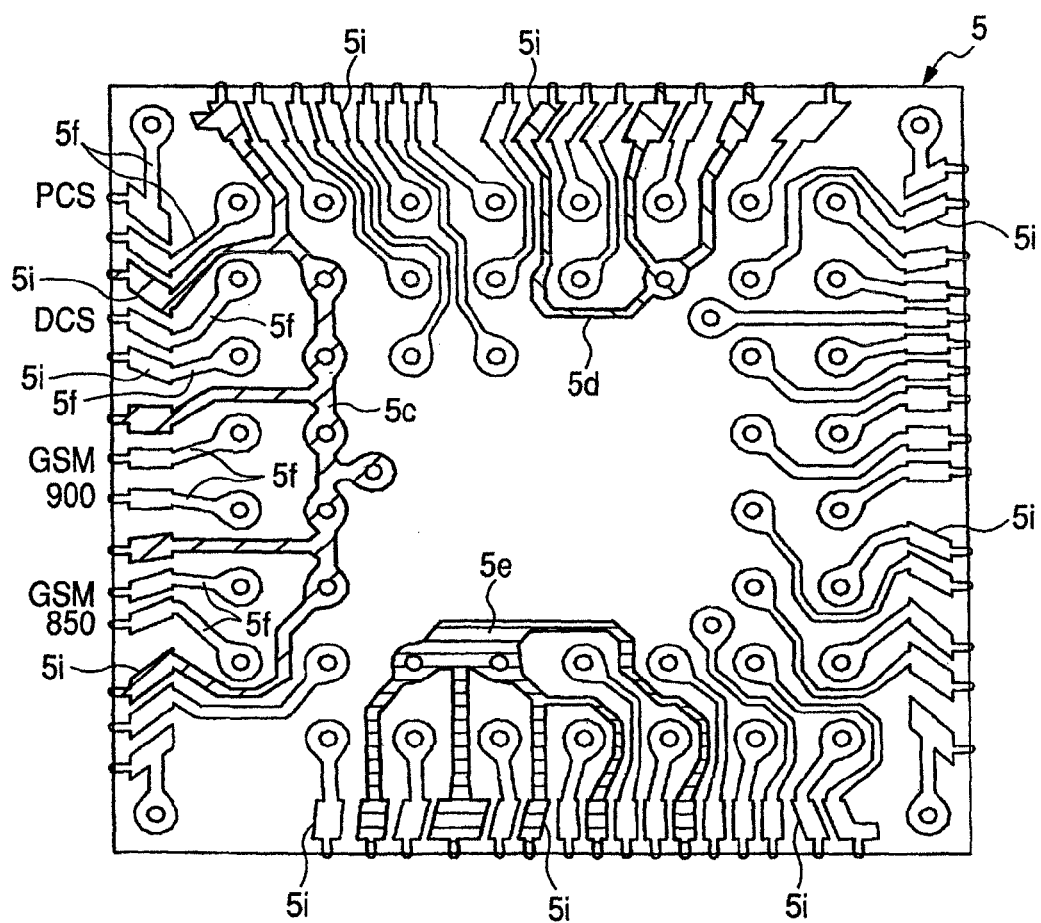
FIG. 4 is a plan view showing an example of a common GND pattern in a wiring layer on the top surface of a wiring substrate incorporated in the semiconductor device shown in FIG. 1.
Figure 5:
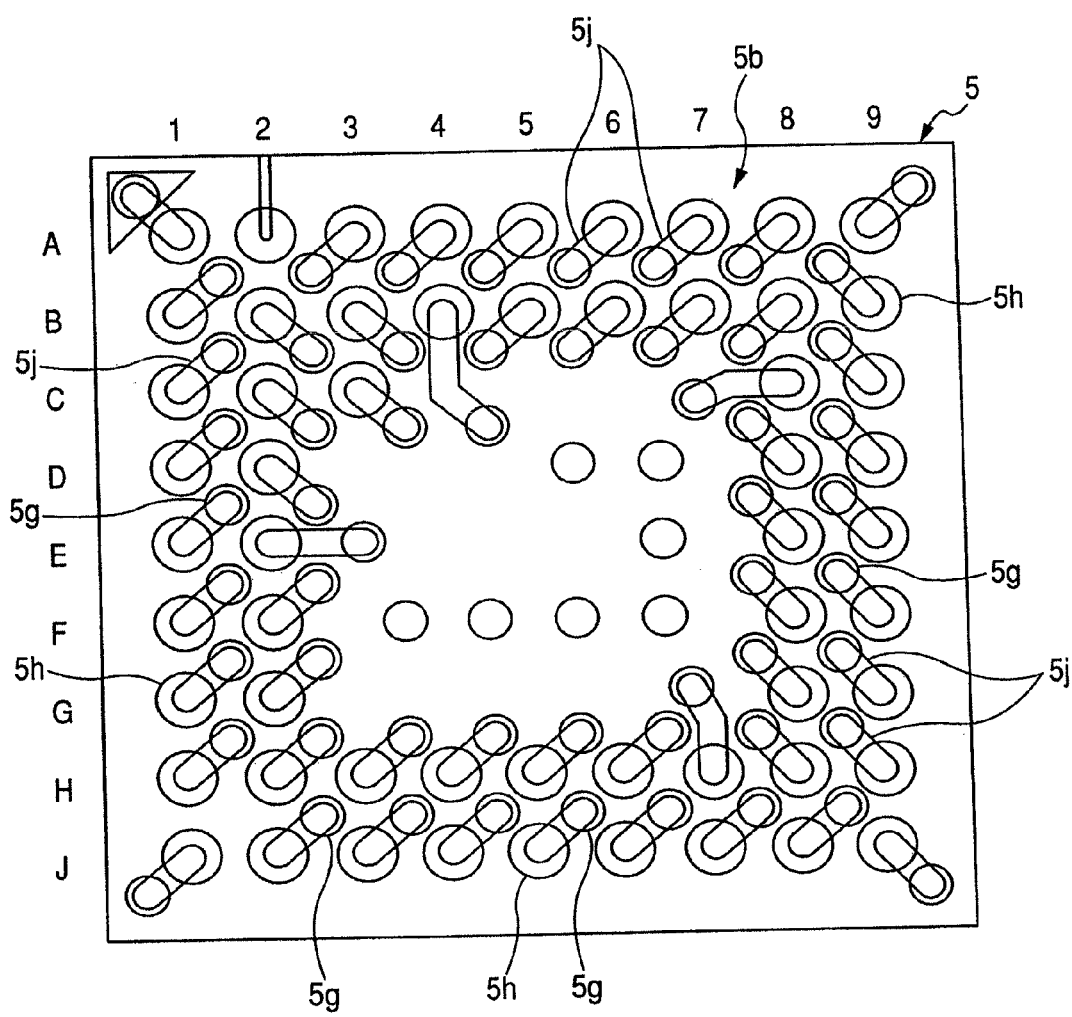
FIG. 5 is a bottom view showing an example of a wiring pattern in a wiring layer on the back surface of the wiring substrate shown in FIG. 4.
Figure 6:
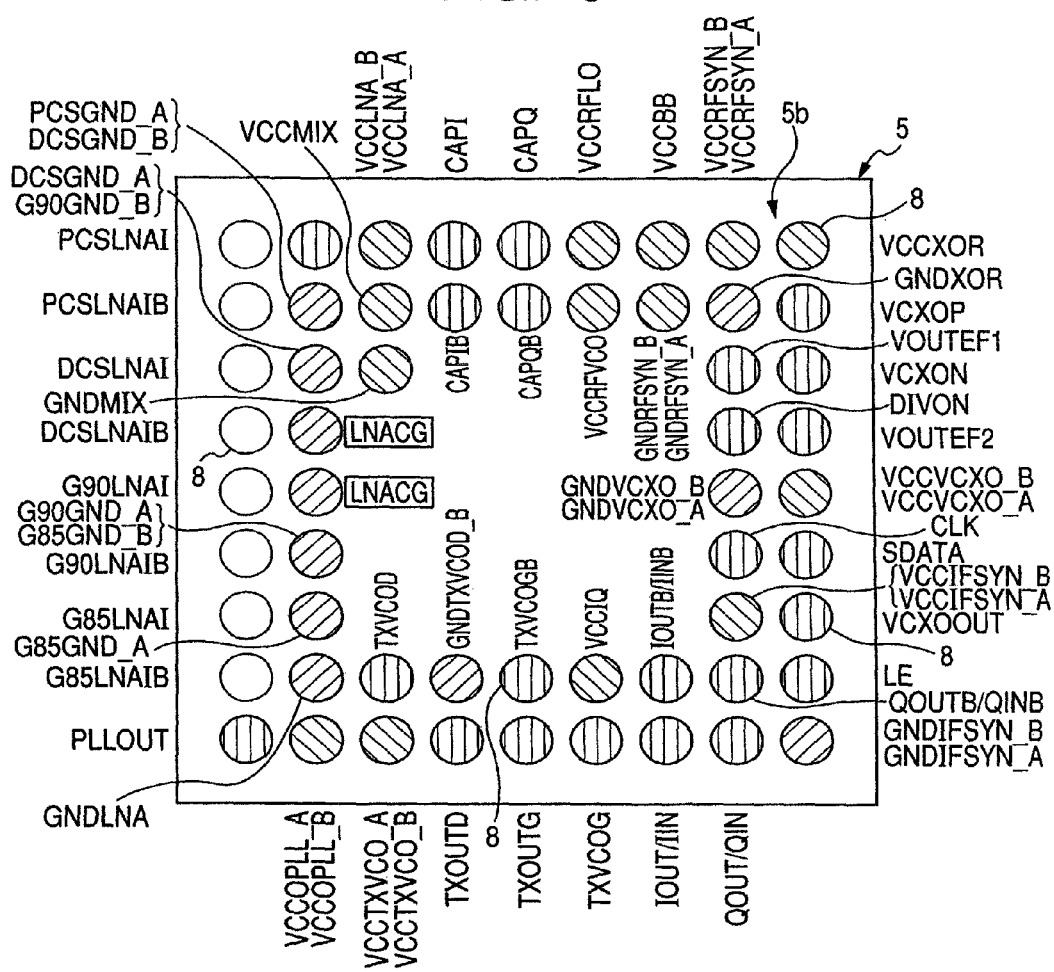
FIG. 6 is a bottom view showing an example of the arrangement of the external terminals of the semiconductor device shown in FIG. 1.
Figure 7:
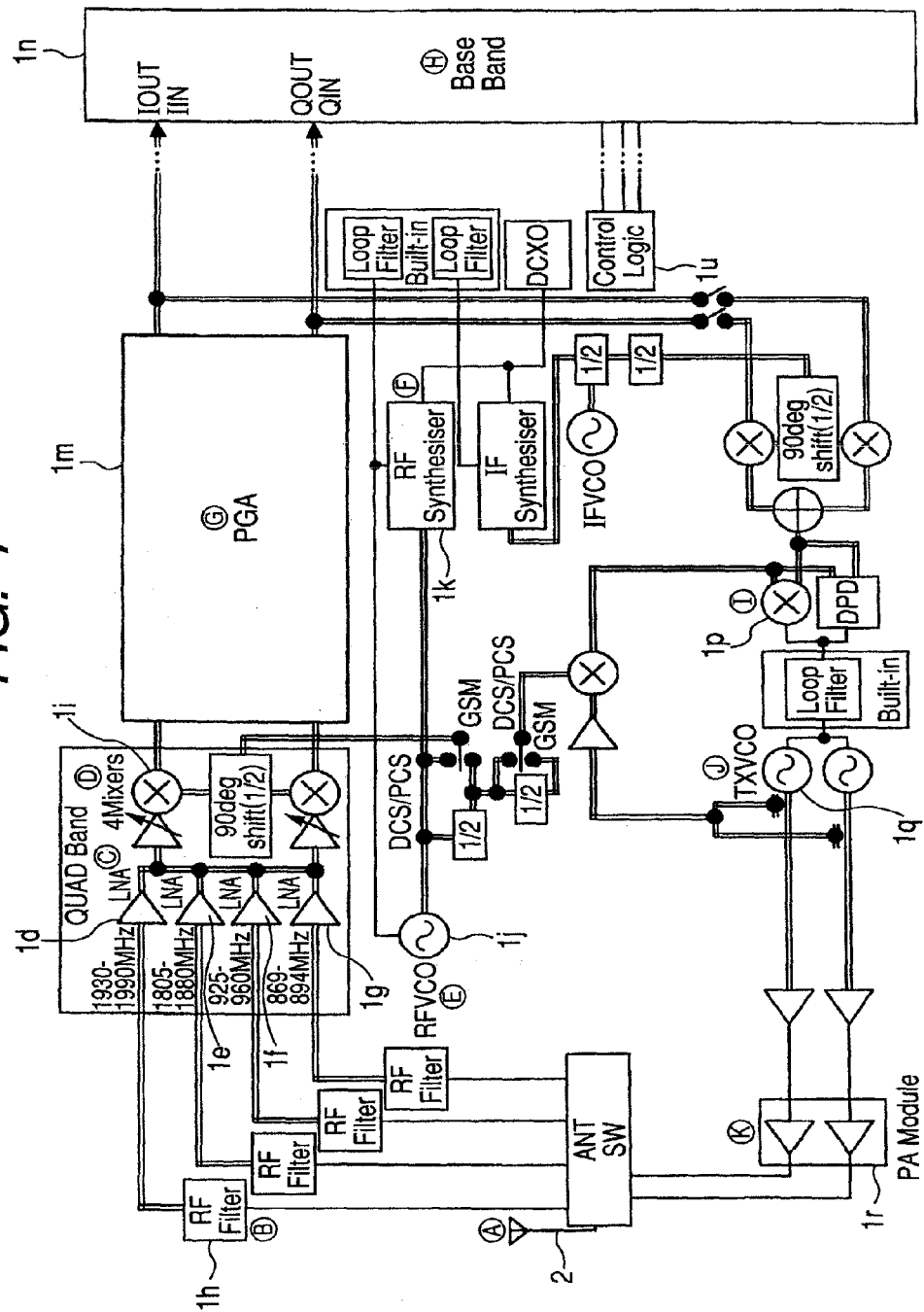
FIG. 7 is a circuit block diagram showing an example of the circuit configuration in a wireless communication apparatus on which the semiconductor device shown in FIG. 1 is mounted.
Figure 8:
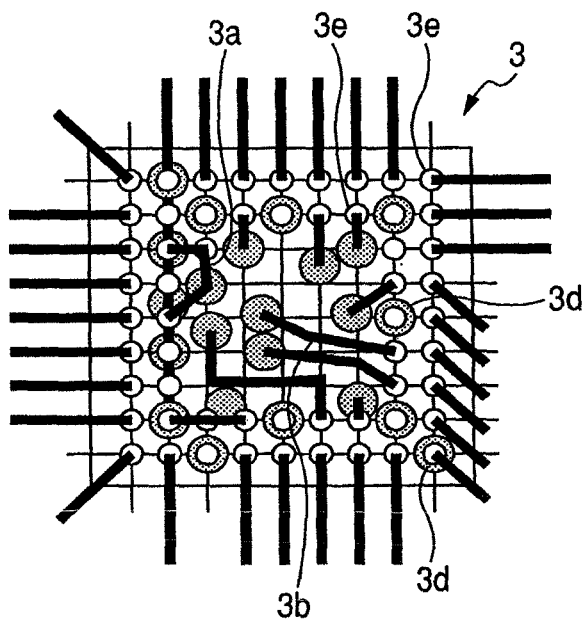
FIG. 8 is a wiring diagram showing an example of a wiring pattern on a packaging substrate on which the semiconductor device shown in FIG. 1 is mounted.
Figure 9:
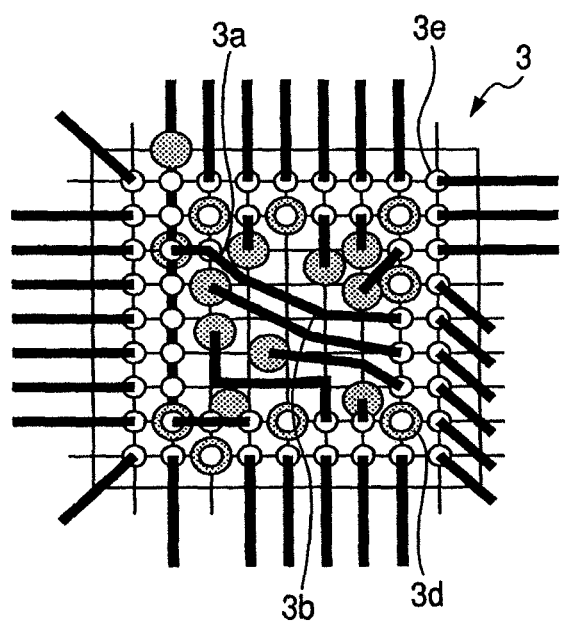
FIG. 9 is a wiring diagram showing a wiring pattern on a packaging substrate as a comparative example to the packaging substrate according to the first embodiment shown in FIG. 8.
Figure 10:
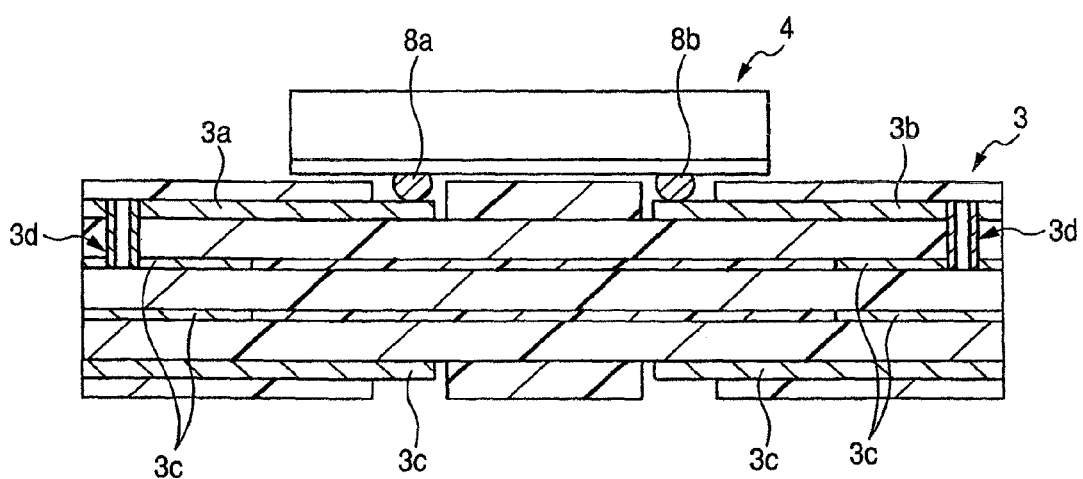
FIG. 10 is a cross-sectional view schematically showing an example of a structure in which the semiconductor device shown in FIG. 1 is mounted on the packaging substrate.

FIG. 1 is a perspective view showing an example of a structure of the semiconductor device according to a first embodiment of the present invention. FIG. 2 is a perspective view showing an example of the arrangement of terminals on the back surface of the semiconductor device shown in FIG. 1. FIG. 3 is a plan view showing an example of the structure of circuit blocks in a semiconductor chip mounted on the semiconductor device shown in FIG. 1 and an example of the connecting condition thereof with bonding electrodes. FIG. 4 is a plan view showing an example of a common GND pattern in a wiring layer on the top surface of a wiring substrate incorporated in the semiconductor device shown in FIG. 1. FIG. 5 is a bottom view showing an example of a wiring pattern in a wiring layer on the back surface of the wiring substrate shown in FIG. 4. FIG. 6 is a bottom view showing an example of the arrangement of the external terminals of the semiconductor device shown in FIG. 1. FIG. 7 is a circuit block diagram showing an example of the circuit configuration in a wireless communication apparatus on which the semiconductor device shown in FIG. 1 is mounted. FIG. 8 is a wiring diagram showing an example of a wiring pattern on a packaging substrate on which the semiconductor device shown in FIG. 1 is mounted. FIG. 9 is a wiring diagram showing a wiring pattern on a packaging substrate as a comparative example to the packaging substrate according to the first embodiment shown in FIG. 8. FIG. 10 is a cross-sectional view schematically showing an example of a structure in which the semiconductor device shown in FIG. 1 is mounted on the packaging substrate.

The semiconductor device according to the first embodiment, as shown in FIGS. 1 and 2, is an RF power module 4 of a BGA (Ball Grid Array) type in which a semiconductor chip 1 is mounted on the main surface 5a of a package substrate 5 serving as a wiring substrate, as shown in FIG. 3, and ball electrodes 8, which serve as a plurality of external terminals, are provided in lines on the back surface 5b of the package substrate 5, as shown in FIG. 2.

In the RF power module 4, the semiconductor chip 1 has been incorporated, as shown in FIG. 3, and pads 1c, which serve as surface electrodes provided on the peripheral portion of the main surface 1a of the semiconductor chip 1, are connected electrically to bonding electrodes 5i provided on the peripheral portion of the main surface 5a of the package substrate 5 in corresponding relation to the pads 1c by using conductive wires 6. These bonding electrodes 5i are further connected electrically to the ball electrodes 8 that are provided on the back surface 5b of the package substrate 5, such that the semiconductor chip 1 operates by exchanging signals with the outside thereof via the ball electrodes 8, which serve as the external terminals.

As shown in FIG. 1, the semiconductor chip 1 and the plurality of wires 6 are covered and molded with a molded element 7, that is formed from a molding resin.

The semiconductor chip 1 is formed from, e.g., silicon, and the conductive wires 6 are, e.g., gold wires. The molded element 7 is obtained by, e.g., thermosetting an epoxy-based resin. The package substrate 5 is obtained by forming a resin substrate with, e.g., a plurality of wires (conductor portions) by using a copper foil or the like. The ball electrodes 8 are formed by, e.g., soldering or the like. However, these members are not limited to those made of the materials mentioned above, and the materials and sizes thereof can be changed variably.

The RF power module 4 according to the first embodiment is a semiconductor package mounted on, e.g., a mobile wireless communication apparatus or the like, so that it necessarily must be miniaturized.

To satisfy this requirement, the miniaturization of the RF power module 4 is formed on the provision of the ball electrodes 8 as external terminals which are less in number than the number of pads 1c on the semiconductor chip 1, while the improvement of the characteristics of the RF power module 4 is achieved by dividing the GND (ground) on the package substrate 5 correspondingly with respect to each of the individual circuit blocks which are composed of a plurality of circuits provided on the semiconductor chip 1.

A description will be given next of the circuit configuration of the semiconductor chip 1 mounted on the RF power module 4. FIG. 3 shows a diagrammatic illustration of the arrangement of the individual circuit portions on the semiconductor chip 1 and the connecting condition between the circuit portions and the bonding electrodes 5i of the package substrate 5 via the wires 6.

The plurality of pads 1c, which serve as surface electrodes, are aligned on the main surface 1a of the semiconductor chip 1 along each of the edges thereof. The individual circuit portions are arranged in different regions internally of the pads 1c. As shown in FIG. 3, a PGA 1m representing a logic circuit portion for control is disposed near the center of the semiconductor chip 1, and a MIXer (mixer) 1i and four LNAs (Low Noise Amplifiers) constituting first circuit portions 1d, 1e, 1f, and 1g are arranged along the left side thereof. On the upper side, an RF VCO (second circuit portion) 1j is positioned; while, an RF Synthsiser 1k, a DC/VCXO 1t, a Control Logic 1u, an IF Synthsiser 1v, and IF VCO 1w are aligned on the right side in a descending order; and a TX VCO (third circuit portion) 1q and an LPF 1s are positioned on the lower side.

It is to be noted that the RF power module 4 according to the first embodiment has functions compatible with, e.g., a dual band communication system to allow communication between a plurality of communication apparatuses using different communication methods (systems). Specifically, e.g., the four LNAs 1d, 1e, 1f, and 1g corresponding to four frequency zones are provided on the semiconductor chip 1 to allow transmission and reception in four bands. The first LNA 1d uses the PCS (Personal Communications Services) method and the frequency zone of, e.g., 1930 to 1990 MHz. The second LNA 1e uses the DCS (Digital Communication System) method and the frequency zone of, e.g., 1805 to 1880 MHz. The third LNA 1f uses the GSM (Global System for Mobile Communications) 90 method and the frequency zone of, e.g., 925 to 960 MHz. The fourth LNA 1g uses the GSM (Global System for Mobile Communications) 85 method and the frequency zone of, e.g., 869 to 894 MHz.

Thus, a circuit configuration which allows transmission and reception in four bands is provided.

A description will be given next of the characteristic portion of the RF power module 4 according to the first embodiment. In the RF power module 4, the GND on the package substrate 5 is provided in a divided relation corresponding to the individual circuit blocks. However, each of the circuit blocks has a common GND used therein.

FIG. 4 shows an example of a wiring pattern of a surface layer wiring in the package substrate 5, in which the GND wire is divided correspondingly relative to the circuit block for the LNAs, the circuit block for the RF VCO, and the circuit block for the IF VCO, while the main circuit portion in each of the blocks is enclosed by the common GND wire within the block.

Specifically, the package substrate 5 is provided with: a first common GND wire (first common conductor portion) 5c which is connected electrically to each of the first circuit portions LNAs 1d, 1e, 1f, and 1g to supply a GND potential to the first circuit portions; a second common GND wire (second common conductor portion) 5d which is connected electrically to the RF VCO 1j on the input side as the second circuit portion to supply the GND potential to the RF VCO 1j; and a third common GND wire (third common conductor portion) 5e which is connected electrically to the IF VCO 1w on the output side as the third circuit portion to supply the GND potential to the IF VCO 1w. Thus, the first, second, and third common GND wires 5c, 5d, and 5e are separated from each other. In each of the circuit blocks, the individual GND wire provided therein is used as a common GND wire.

Each of the LNAs 1d, 1e, 1f, and 1g serving as the first circuit portions amplifies an extremely weak signal inputted at a high frequency. The RF VCO 1j on the input side serving as the second circuit portion converts the high frequency of the signal supplied from any of the LNAs 1d, 1e, 1f, and 1g to a low frequency. The IF VCO 1w on the output side serving as the third circuit portion converts the low frequency of a signal supplied from a baseband 1n shown in FIG. 7 to a high frequency.

Consequently, if the RF VCO 1j and the IF VCO 1w are operating actively for frequency conversion in the vicinity of the LNAs 1d, 1e, 1f, and 1g in a state in which the GND is undivided and is used in common by the individual circuit blocks, the GND for each of the LNAs 1d, 1e, 1f, and 1g fluctuates so that the GND is not supplied stably. In contrast, if the GND is divided correspondingly relative to the individual circuit blocks as in the first embodiment, a structure free from a common impedance can be obtained, so that the GND for each of the circuit blocks is supplied stably. In other words, it becomes possible to reduce the common impedance and improve the characteristics of the RF power module 4.

In addition, the first common GND wire (first common conductor potion) 5c, which is disposed between each of two adjacent ones of a plurality of wiring portions 5f provided correspondingly relative to the individual LNAs 1d, 1e, 1f, and 1g, as shown in FIG. 4, shields noise occurring between the bands and, thereby, achieves a reduction in the influence of the noise on the wiring portions 5f in the adjacent bands.

Since the plurality of wiring portions 5f provided correspondingly relative to the individual LNAs 1d, 1e, 1f, and 1g are enclosed by the first common GND wire 5c, the influence of noise occurring between bands on the wiring portions 5f in the adjacent bands can be reduced reliably.

On the package substrate 5 of the RF power module 4, the GND wire in each of the circuit blocks is used as a common GND wire. In addition, the bonding electrodes 5i, which are connected to the pads 1c for GND for each of the LNAs 1d, 1e, 1f, and 1g of the semiconductor chip 1 via the wires 6, are connected to the first common GND wire 5c on the package substrate 5. The bonding electrodes 5i, which are connected to the pads 1c for GND for the RF VCO 1j of the semiconductor chip 1 via the wires 6, are also connected to the second common GND wire 5d on the package substrate 5, while the bonding electrodes 5i, which are connected to the pads 1c for GND for the IF VCO 1w of the semiconductor chip 1 via the wires 6, are also connected to the third common GND wire 5e on the package substrate 5. Furthermore, the first, second, and third, common GND wires 5c, 5d, and 5e are connected to corresponding bump lands 5h (ball electrodes 8) on the back surface 5b of the package substrate 5.

Accordingly, the number of the bump lands 5h on the back surface 5b, which are connected to wiring portions 5j of back surface side shown in FIG. 5, is smaller than the number of bonding electrodes 5i in the surface layer wiring shown in FIG. 4, which is connected to wiring of back surface side via through-hole wires 5g, since the GND wire in each of the circuit blocks is the common GND wire used therein.

Specifically, the number of the ball electrodes 8, which serve as the external terminals shown in FIG. 6, which are to be attached to the bump lands 5h, is smaller than the number of the bonding electrodes 5i that are connected to the pads 1c on the semiconductor chip 1 on the package substrate 5 using the wires 6. As a result, it becomes possible to reduce the number of external terminals and miniaturize the RF power module 4.

As shown in FIG. 3, in the RF power module 4 according to the first embodiment, the pads 1c on the semiconductor chip 1 and the bonding electrodes 5i on the main surface 5a of the package substrate 5 are connected electrically through coupling using the wires 6. At the time of coupling, some of the bonding electrodes 5i for GND, which are among the plurality of bonding electrodes 5i on the package substrate 5, are each connected to the two pads 1c for GND in a one-to-two correspondence via the wires 6.

This is based on the fact that the number of the bonding electrodes 5i on the package substrate 5 is smaller than the number of the pads 1c on the semiconductor chip 1.

Conversely, the number of pads 1c on the semiconductor chip 1 is larger than the number of bonding electrodes 5i on the package substrate 5, which allows easy design of a pad layout on the semiconductor chip 1.

In the case of the RF power module 4 according to the first embodiment, the number of pads 1c on the semiconductor chip 1 is 68 and the number of bonding electrodes 5i on the package substrate 5 is 61, as shown in FIG. 3, while the number of the ball electrodes 8 which serve as external terminals is 57, as shown in FIG. 6. Accordingly, the number of the pads 1c on the semiconductor chip 1 is larger than the number of the bonding electrodes 5i on the package substrate 5, and the number of the bonding electrodes 5i on the package substrate 5 is larger than the number of ball electrodes 8.

A description will be given next of the circuit operation of the RF power module 4, with reference to FIG. 7.

FIG. 7 shows an example of a circuit block diagram in a wireless communication apparatus on which the RF power module 4 shown in FIG. 1 is mounted.

During reception, an extremely weak signal, which is received from an antenna 2 (in the portion A) and includes voice data (at, e.g., 50 kHz) and a carrier (in accordance with the band), is subjected to noise removal using an RF filter (Filter) 1h (in the portion B), and the extremely weak signal is amplified in each of the LNAs 1d, 1e, 1f, and 1g (in the portion C). Further, a frequency serving as a reference, which is controlled by the RF Synthsiser 1k (in the portion F) is supplied from the RF VCO 1j (in the portion E) to the MIXer 1i (in the portion D), and the carrier is removed from the signal supplied from each of the LNAs 1d, 1e, 1f, and 1g in the MIXer 1i (the frequency is lowered).

Thereafter, only the voice data is supplied to the PGA 1m (in the portion G) where the gain (Gain) is controlled in the PGA 1m. The voice data with the controlled gain is then supplied to the baseband 1n (in the portion H) and voice is heard via a speaker.

During transmission, on the other hand, the voice (voice data) is uttered via a microphone and the frequency is raised (the carrier is imposed) in accordance with the band for transmission in the MIXer 1p (in the portion I) and in the IF VCO 1w (in the portion J). Then, the extremely weak signal is amplified in a PA (power amplifier) 1r (in the portion K), and the signal having voice data and a carrier is outputted again from the antenna 2 (in the portion A).

Thus, in the RF power module 4 according to the first embodiment, the first common GND wire 5c for supplying the GND potential to each of the LNAs 1d, 1e, 1f, and 1g, the second common GND wire 5d for supplying the GND potential to the RF VCO 1j, and the third common GND wire 5e for supplying the GND potential to the IF VCO 1w are separated from each other in the signal flow. This prevents the individual circuit blocks from having a common impedance, while allowing each of them to have a common GND to be used therein.

Since the GND has thus been divided correspondingly relative to the individual circuits, the characteristics of the RF power module 4 can be improved by reducing the common impedance.

By providing the common GND wire in each of the circuit blocks to be used therein, the RF power module 4 can be miniaturized. As a result, it becomes possible to implement both the miniaturization of the RF power module 4 and an improvement of the characteristics thereof.

A description will be given next of a structure in which the RF power module 4 according to the first embodiment is mounted on a packaging substrate.

FIG. 10 is a schematic diagram showing an example of the structure in which the RF power module 4 is mounted on a packaging substrate 3. The packaging substrate 3 shown in FIG. 10 is a substrate having a multilayered wiring structure, in which the surface layer wiring is provided with a first common wire on the substrate side (first common conductor portion of substrate side) 3a connected electrically to the LNAs 1d, 1e, 1f, and 1g, which serve as the first circuit portions of the RF power module 4, and with a second common wire on the substrate side 3b connected electrically to the RF VCO 1j, which serves as the second circuit portion. The first common wire 3a is connected electrically to the RF power module 4 via GND ball electrodes 8a for the LNAs.

The second common wire 3b is connected electrically to the RF power module 4 via GND balls 8b for the VCOs.

In the packaging substrate 3, the first common wire 3a and the second common wire 3b are separated from each other in the surface layer wiring at least in the region corresponding to the bottom portion of the main body of the RF power module 4. This is because the surface layer wiring is connected electrically directly to the ball electrodes 8 of the RF power module 4 and is therefore particularly susceptible to the influence of noise, so that the first common wire 3a and the second common wire 3b are preferably separated, as shown in FIG. 10.

FIG. 8 shows a wiring pattern of the surface layer wiring of the packaging substrate 3, in which a plurality of terminals 3e, which are connected electrically to the ball electrodes 8 of the RF power module 4, are provided in accordance with the arrangement thereof. The first common wire one the substrate side 3a and the second common wire on the substrate side 3b are separated from each other in the region corresponding to the bottom portion of the main body of the RF power module 4.

That is, in the structure in which the RF power module 4 according to the first embodiment is mounted, the common GND wire for the LNAs is separated from the GND wires for the RF VCO 1j and the IF VCO 1w or for the other circuit portions, such as the output and the synthesizers on the packaging substrate 3. This allows for a reduction in the influence of noise received by each of the GND wires from the other GND wires. As a result, each of the GNDs can be supplied stably.

Although the first common wire on the substrate side 3a and the second common wire on the substrate side 3b are connected electrically to internal wires 3c for GND in inner layers via through-hole wires 3d, these internal wires 3c are also divided preferably in the region corresponding to the bottom portion of the main body of the RF power module 4, as shown in FIG. 10. However, the first common wire 3a and the second common wire 3b are connected electrically to each other at a portion which is disposed at a distance from the region of the packaging substrate 3 on which the RF power module 4 is mounted and are connected to a common wire for GND.

Since the first common wire on the substrate side 3a is thus separated from the wires for GND for the other circuit portions, such as the second common wire on the substrate side 3b, in the region of the packaging substrate 3 located under the RF power module 4, the influence of noise received by each of the GND wires from the other GND wires can be reduced compared with that received in a substrate structure in which the first common wire 3a and the second common wire 3b, which is among the other circuit portions, are connected in the region on which the RF power module is mounted, as shown in the comparative example of FIG. 9. Accordingly each of the GNDs can be supplied stably.

As a result, even in a structure in which the RF power module 3 is mounted on the packaging substrate 3, it becomes possible to improve the characteristics of the RF power module 4 by reducing the common impedance.

Embodiment 2

Figure 11:
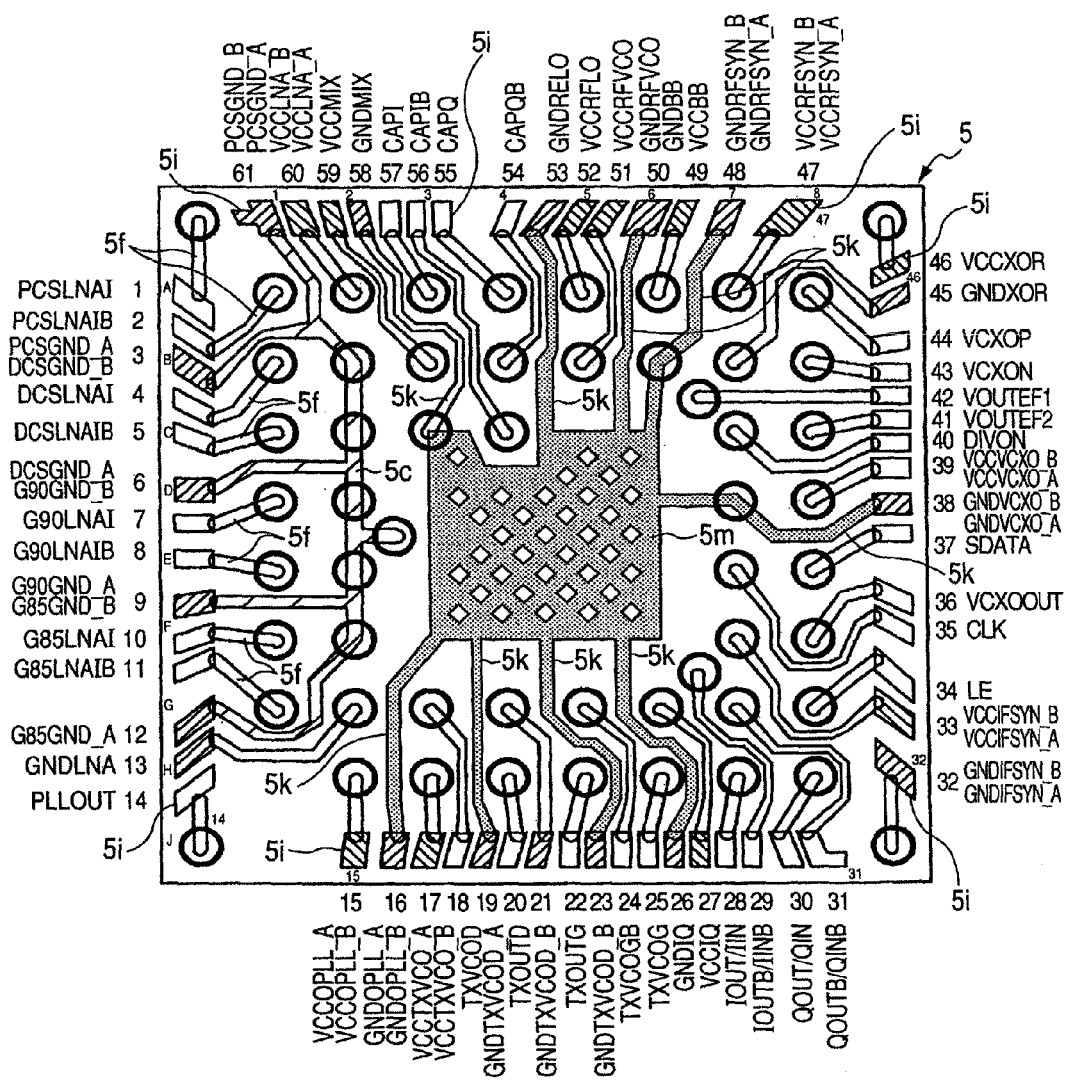
FIG. 11 is a plan view showing an example of a wiring pattern in a wiring layer on the top surface of a packaging substrate incorporated in a semiconductor device according to a second embodiment of the present invention.
Figure 12:
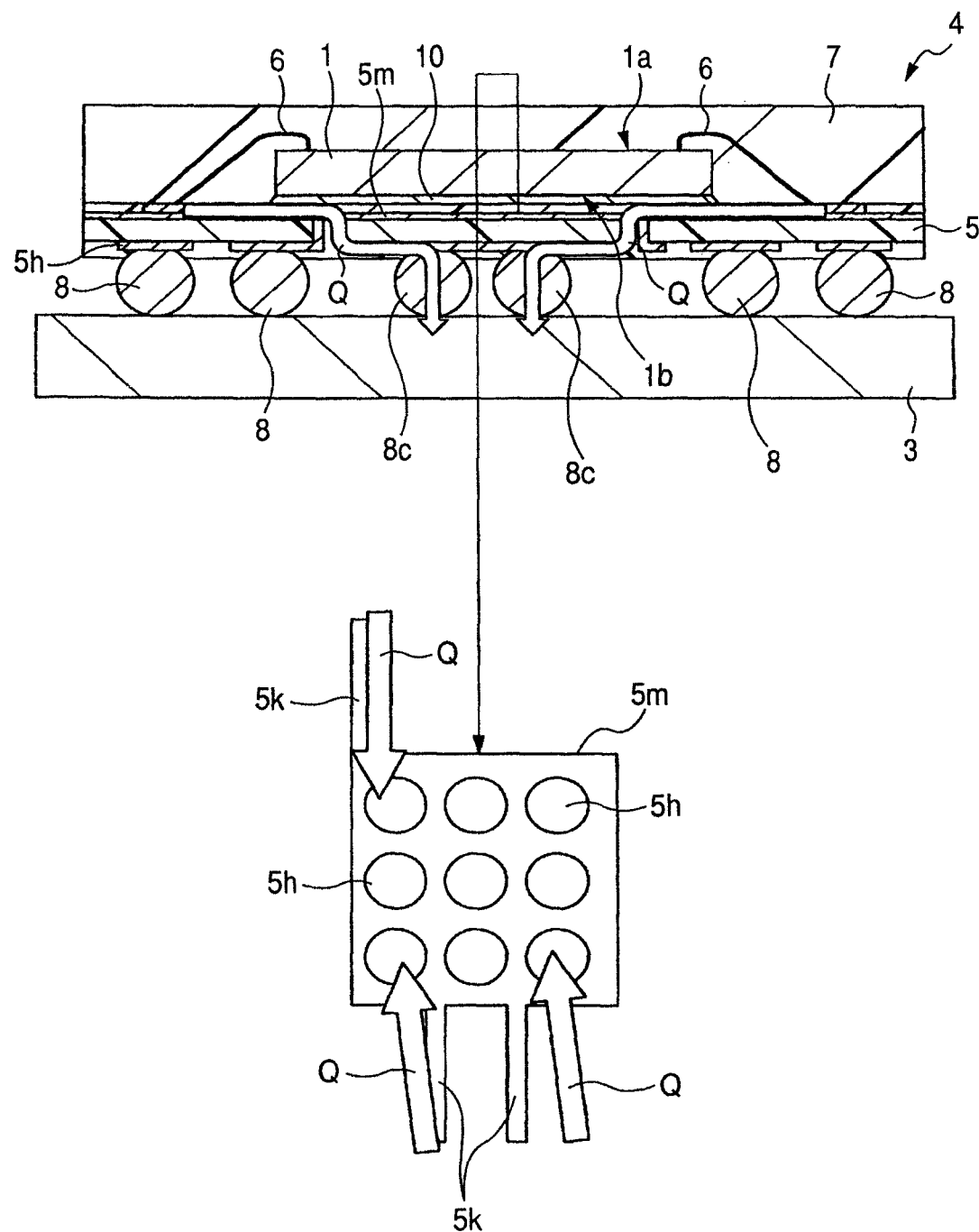
FIG. 12 is a cross-sectional view showing a structure in which a semiconductor device, incorporating a variation using the wiring pattern shown in FIG. 11, is mounted, and a plan view of a planar conductor portion.
Figure 13:
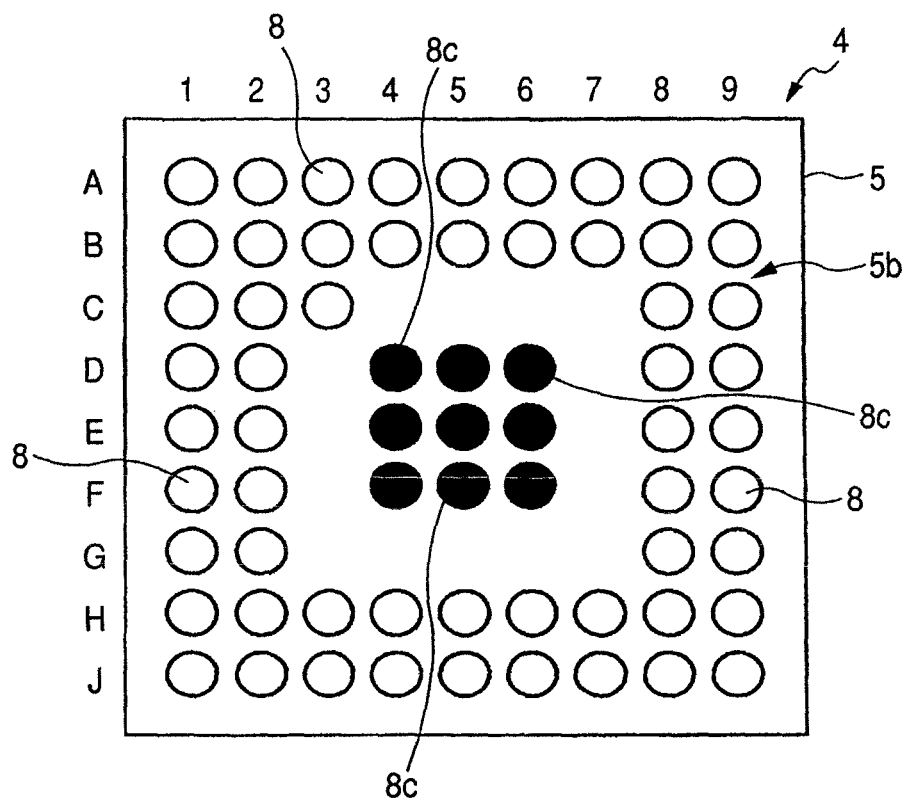
FIG. 13 is a bottom view showing the arrangement of external terminals in the semiconductor device incorporating the variation shown in FIG. 12.
Figure 14:
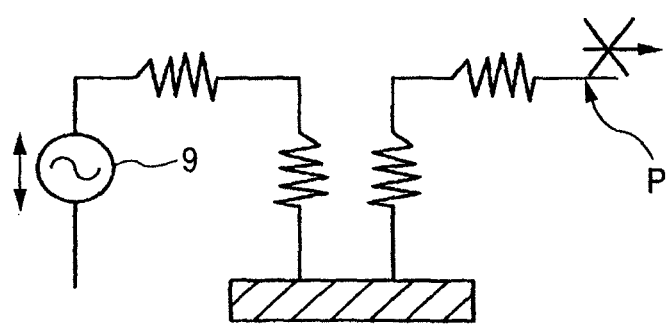
FIG. 14 is a circuit diagram showing an example of a no-leakage-current state in the semiconductor device incorporating the variation shown in FIG. 12.

FIG. 11 is a plan view showing an example of a wiring pattern in a wiring layer on the top surface of a packaging substrate incorporated in a semiconductor device according to a second embodiment of the present invention. FIG. 12 is a cross-sectional view showing a structure in which a semiconductor device, incorporating a variation using the wiring pattern shown in FIG. 11, is mounted and a plan view of a planar conductor portion. FIG. 13 is a bottom view showing the arrangement of external terminals in the semiconductor device incorporating the variation shown in FIG. 12. FIG. 14 is a circuit diagram showing an example of a no-leakage-current state in the semiconductor device incorporating the variation shown in FIG. 12.

The semiconductor device according to the second embodiment is the same semiconductor package as the RF power module 4 according to the first embodiment, in which the GND common wires are provided in separate relation corresponding to the individual circuit blocks of the semiconductor chip 1; except that, on the package substrate 5, the first common GND wire (first common conductor portion) 5c for supplying the GND potential to each of the LNAs 1d, 1e, 1f, and 1g, which serve as the first circuit portions of the semiconductor chip 1, is provided separately from the fourth common GND wires (other common conductor portions) 5k for supplying the GND potential to the plurality of other circuit portions (the circuit portions, such as the RF VCO 1j, the IF VCO 1w, and the synthesizers). In addition, a planar GND wire 5m, which serves as a planar conductor portion, is formed at the near center portion of the main surface 5a of the package substrate 5a, such that the wires for GND for the plurality of other circuit portions are connected to the planar GND wire 5m via the fourth common GND wires 5k.

Specifically, in dividing the GND common wire correspondingly relative to the individual circuit blocks of the semiconductor chip 1, the LNAs 1d, 1e, 1f, and 1g, which serve as the first circuit portions, are separated from the other circuit portions, so that the wire for GND is divided into two types, which include the first common GND wire 5c serving as the common GND wire for the LNAs and the fourth common GND wires 5k serving as the common GND wires for the other circuit portions. Moreover, the fourth common GND wires 5k for the other circuit portions are connected to the planar GND wire 5m, such that the common GND wire is shared among the other circuit portions.

On the LNA side of the package substrate 5, the first common GND wire 5c is disposed between each two adjacent ones of the plurality of wiring portions 5f provided correspondingly relative to the individual LNAs 1d, 1e, 1f, and 1g, as shown in FIG. 11, in the same manner as with the package substrate 5 of the RF power module 4 according to the first embodiment.

In the RF power module 4 using such a package substrate 5 according to the second embodiment, the plurality of ball electrodes 8, which are connected electrically to the planar GND wire 5m, are provided at positions corresponding to the planar GND wire 5m on the back surface 5b of the package substrate 5, as shown in FIGS. 12 and 13.

Specifically, ball electrodes 8c for the common GND, which are the ball electrodes 8 that are connected electrically to the planar GND wire 5m, are positioned immediately under the planar GND wire 5m. This makes it possible to reduce the potential of the power supply 9 shown in FIG. 14 to the GND for the package substrate 5 without causing a leakage current in either the LNA side or the other-circuit-portion side (in the no leakage state shown in the portion P of FIG. 14), as shown in the current flow in the portion Q of FIG. 12.

Since the common GND wire is thus shared among the circuit portions other than the LNAs, the shielding effect on each of the circuits is weakened compared with that in the RF power module 4 according to the first embodiment, but the characteristics of the RF power module 4 according to the second embodiment can also be improved through stabilization of the GND. In addition, the number of external terminals of the RF power module 4 can be reduced, since the planar GND wire 5m allows for the sharing of the common GND wire among the circuit portions, other than the LNAs.

As shown in FIG. 12, the semiconductor chip 1 is mounted at a position above the planar GND wire 5m over the main surface 5a of the package substrate 5, with a die bonding material 10 being connected to the back surface 1b of the semiconductor chip 1.

Although the invention achieved by the present inventors has been described specifically based on the embodiments thereof, the present invention is not limited to the embodiments described above. It will easily be appreciated that various changes and modifications can be made in the invention without departing from the gist thereof.

For example, although a 4-band RF power module 4 provided with low noise amplifiers (LNAs) corresponding to the four frequencies has been described above in each of the first and second embodiments, the number of bands for the RF power module 4 is not particularly limited.

Although each of the first and second embodiments has been described above by using, as an example, the case where the semiconductor device is of a BGA type having ball electrodes 8 as the external terminals, the semiconductor device may also use external terminals other than the ball electrodes 8, provided that the semiconductor chip 1 is mounted on the wiring substrate and the GND wires for at least two circuit portions incorporated in the semiconductor chip 1 are provided in a separate relation on the wiring substrate. For example, the semiconductor device described above may also be of an LGA (Land Grid Array) type.

The present invention is appropriate for use in an electronic device and a semiconductor device.

What we claim is:

1. A semiconductor device comprising:
   a semiconductor chip including a main surface, a back surface opposite to the main surface, a plurality of pads arranged over the main surface, and a plurality of low noise amplifiers arranged over the main surface, the plurality of the pads including a first pad and a second pad, the plurality of the low noise amplifiers including a first low noise amplifier and a second low noise amplifier for amplifying an inputted signal, the first pad and the second pad being electrically connected to the first low noise amplifier and the second low noise amplifier, respectively;
   a wiring substrate including a main surface, a back surface opposite to the main surface, a plurality of electrodes arranged over the main surface of the wiring substrate, the plurality of electrodes including a first electrode, a second electrode, a first GND electrode, a second GND electrode, and a third GND electrode; and
   a plurality of external terminals arranged over the back surface of the wiring substrate and being electrically connected to the plurality of electrodes;
   wherein the semiconductor chip is mounted over the main surface of the wiring substrate, and the first and second pads of the semiconductor chip are electrically connected the first and second electrodes of the wiring substrate, respectively,
   wherein the first and second electrodes are disposed between the first and second GND electrodes, and the third GND electrode is disposed between the first and second electrodes,
   wherein the wiring substrate further includes a first conductor pattern and a second conductor pattern which are disposed over the main surface of the wiring substrate,
   wherein the first conductor pattern electrically connects the first GND electrode and the second GND electrode to each other and surrounds the first and second electrodes in a plan view,
   wherein the second conductor pattern electrically connects the first conductor pattern and the third GND electrode to each other and is arranged between the first and second electrodes in the plan view, and
   wherein the first conductor pattern extends toward an inside of the semiconductor chip from the first and second GND electrodes in the plan view.

2. A semiconductor device according to claim 1, wherein the second conductor pattern extends toward the inside of the semiconductor chip from the third GND electrode in the plan view.

3. A semiconductor device according to claim 1, wherein each of the first and second pads of the semiconductor chip is electrically connected to each of the first and second electrodes of the wiring substrate with a conductive material.

4. A semiconductor device according to claim 3, wherein the first pad is electrically connected to the first electrode with a first conductive wire, and
   wherein the second pad is electrically connected to the second electrode with a second conductive wire.

5. A semiconductor device according to claim 3, wherein the semiconductor chip, the conductive material and the plurality of the electrodes of the wiring substrate are molded with molding resin.

6. A semiconductor device according to claim 1, wherein the first and second conductor patterns are electrically connected external terminals which are configured to be supplied with a GND potential from an outside of the plurality of the external terminals.

7. A semiconductor device according to claim 1, wherein the semiconductor chip includes a first GND pad and a second GND pad,
   wherein the first and second GND pads are electrically connected to the first and second low noise amplifiers, respectively; and
   wherein the first and second GND pads of the semiconductor chip are electrically connected to the third GND electrode of the wiring substrate.

8. A semiconductor device according to claim 7, wherein each of the first and second GND pads are electrically connected to the third GND electrode with third conductive wires.

9. A semiconductor device according to claim 1, the semiconductor chip including a third pad and, a RFVCO (Radio Frequency Voltage Controlled Oscillator) configured to convert a frequency of a signal supplied from any of the plurality of the low noise amplifiers arranged over the main surface of the semiconductor chip, the third pad being electrically connected to the RFVCO;
   wherein the wiring substrate includes a third electrode, a fourth GND electrode, and a fifth GND electrode,
   wherein a third electrode is disposed over the main surface of the wiring substrate,
   wherein the third pad of the semiconductor chip is electrically connected to the third electrode
   wherein the third electrode is disposed between the fourth and fifth GND electrodes,
   wherein the wiring substrate further includes a third conductor pattern which is disposed over the main surface of the wiring substrate, wherein the third conductor pattern electrically connects the fourth and fifth GND electrodes to each other and surrounds the third electrode in the plan view, and wherein the third conductor pattern extends toward the inside of the semiconductor chip from the fourth and fifth GND electrodes in the plan view.

10. A semiconductor device according to claim 9, wherein the first and second electrodes are disposed along a side of the wiring substrate, and wherein the third electrode is disposed along a side different from the side on which the first and second electrodes are disposed.

11. A semiconductor device according to claim 9, wherein the third pad of the semiconductor chip is electrically connected to the third electrode of the wiring substrate with a conductive material.

12. A semiconductor device according to claim 11, wherein the third pad is electrically connected to the third electrode with a third conductive wire.

13. A semiconductor device according to claim 9, wherein the first conductor pattern and the third conductor pattern are electrically separated.

14. A semiconductor device according to claim 9, the semiconductor chip including a third GND pad, the third GND pad being electrically connected to the RFVCO, wherein the third GND pad is electrically connected to the fourth GND electrode of the wiring substrate.

15. A semiconductor device according to claim 14, wherein the third GND pad is electrically connected to the fourth GND electrode with a fifth conductive wire.

* * * * *